United States Patent
Goo et al.

[11] Patent Number: 6,057,251
[45] Date of Patent: May 2, 2000

[54] METHOD FOR FORMING INTERLEVEL DIELECTRIC LAYER IN SEMICONDUCTOR DEVICE USING ELECTRON BEAMS

[75] Inventors: Ju-seon Goo, Suwon; Seong-ho Kim, Yongin; Hae-jeong Lee, Suwon; Byung-keun Hwang, Anyang, all of Rep. of Korea

[73] Assignee: Samsung Electronics, Co., Ltd., Suwon, Rep. of Korea

[21] Appl. No.: 09/164,938

[22] Filed: Oct. 1, 1998

[30] Foreign Application Priority Data

Oct. 2, 1997 [KR] Rep. of Korea ............ 97-50971

[51] Int. Cl.⁷ ............................................. H01L 21/31
[52] U.S. Cl. ................................... 438/788; 438/487
[58] Field of Search ........................ 438/787–788, 438/487, 535

[56] References Cited

U.S. PATENT DOCUMENTS

| | | | |
|---|---|---|---|
| 3,617,375 | 11/1971 | Marek et al. | 438/788 |
| 3,877,980 | 4/1975 | Martin et al. | 430/296 |
| 4,495,218 | 1/1985 | Azuma et al. | 438/788 |
| 5,232,749 | 8/1993 | Gilton | 438/788 |
| 5,387,546 | 2/1995 | Maeda et al. | 438/788 |
| 5,630,905 | 5/1997 | Lynch et al. | 438/507 |
| 5,660,957 | 8/1997 | Chou et al. | 430/5 |
| 5,883,004 | 3/1999 | Shiu et al. | 438/692 |

*Primary Examiner*—Olik Chaudhuri
*Assistant Examiner*—Anh Duy Mai
*Attorney, Agent, or Firm*—Marger Johnson & McCollom, P.C.

[57] ABSTRACT

A method for stabilizing an interlevel dielectric layer formed by a chemical vapor deposition (CVD) process, using electron beams. A CVD oxide layer is formed on a semiconductor substrate. The CVD oxide layer is radiated with electron beams at a temperature of between approximately room temperature and approximately 500° C. for a predetermined time, using an electron beam radiator, to densify the layer.

19 Claims, 5 Drawing Sheets

METHOD FOR FORMING INTERLEVEL DIELECTRIC LAYER IN SEMICONDUCTOR DEVICE USING ELECTRON BEAMS

BACKGROUND OF THE INVENTION

1. Field of the Invention

The present invention relates to a method for manufacturing a semiconductor device, and more particularly, to a method for stabilizing an interlevel dielectric layer.

2. Description of the Related Art

In general, as semiconductor devices become more integrated, the steps on such semiconductor substrates become larger. The steps cause diffused reflection during a photolithography process, and thus a desired pattern may not be obtained. An interlevel dielectric layer having a high degree of planarization is therefore desirable.

Also, the planarization of the interlevel dielectric layer improves step coverage of a conductive layer to be formed thereon and allows the use of a wider range of thicknesses and line widths of underlying conductive layers.

A phospho-silicate glass (PSG) layer, a boro-phospho-silicate glass (BPSG) layer and an undoped silicate glass (USG) layer, which are formed by a CVD process, are typically used for the interlevel dielectric layer. Since these layers are porous in comparison with a thermal oxide film, humidification can occur in these layers during subsequent processes. When these humidified layers are used for the interlevel dielectric layer, hot carriers are degraded by —OH groups in the interlevel dielectric layer, thereby deteriorating the reliability of the semiconductor device. Also, the dielectric constant of an interlevel dielectric layer increases proportional to humidity, which causes delayed signal transmission or noise.

Also, a chemical mechanical polishing (CMP) process, which is widely used as a global planarization method, may be adapted to planarize an interlevel dielectric layer. Humidification after the CMP process may increase if the interlevel dielectric layer is not hard enough. In addition, defects such as scratches can occur during the CMP process.

Conventionally, an interlevel dielectric layer is first formed, and then cured with high temperature treatment of 800° C. or more to prevent humidification of the interlevel dielectric layer. A semiconductor memory device with a storage capacity of 256 Mb or more employs a dielectric material having a high dielectric constant such as TaO or BST. When a dielectric material layer having a high dielectric constant is formed on a semiconductor substrate, the semiconductor substrate can not tolerate the high temperature heat treatment.

Accordingly, a need exists for a method to prevent humidification in a low temperature process.

SUMMARY OF THE INVENTION

It is an object of the present invention to provide a method for forming an interlevel dielectric layer in a semiconductor device in which a low-humidity interlevel dielectric layer is formed by a low temperature process.

To accomplish the above object, a CVD oxide layer is formed on a semiconductor substrate. The CVD oxide layer is densified by radiating it with electron beams at a temperature of between approximately room temperature and approximately 500° C. for a predetermined time.

Before forming the CVD oxide layer, a conductive layer pattern may be formed on an insulating layer over a semiconductor substrate. And the step of forming a first capping layer covering the conductive layer pattern can be further included. Here, the CVD oxide layer is formed on this resultant structure.

After radiating the CVD oxider layer with electron beams, the CVD oxide layer may be planarized. The planarized CVD oxide layer is radiated with electron beams at a temperature of between approximately room temperature and approximately 500° C. for a predetermined time, using an electron beam radiator.

After radiating the planarized CVD oxide layer, a second capping layer may be formed on the planarized layer. The second capping layer may also be radiated with electron beams at a temperature of between approximately room temperature and approximately 500° C. for a predetermined time.

Also, according to another method embodiment for forming an interlevel dielectric layer, a CVD oxide layer is formed on a semiconductor substrate. The CVD oxide layer is planarized through a CMP process. The planarized CVD oxide layer is densified by being radiated with electron beams at a temperature of between approximately room temperature and approximately 500° C. for a predetermined time.

According to still embodiment of the invention, a capping layer composed of an oxide layer is formed on the planarized oxide layer by a CVD process. The capping layer is radiated with electron beams at a temperature of between approximately room temperature and approximately 500° C. for a predetermined time to density the layer.

According to the present invention, moisture absorbed into an interlevel dielectric oxide layer during a CVD process can be effectively removed, and the possibility of humidification in the interlevel dielectric layer during subsequent processes may be effectively prevented by using a low temperature process.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

According to the present invention, the electron beams radiate an interlevel dielectric layer formed by a chemical vapor deposition (CVD) process under predetermined conditions at a relatively low temperature to density the interlevel dielectric layer. By that process, moisture absorbed into the interlevel dielectric layer is greatly reduced, and the humidification of the interlevel dielectric layer can be prevented in subsequent processes.

Figure 1:
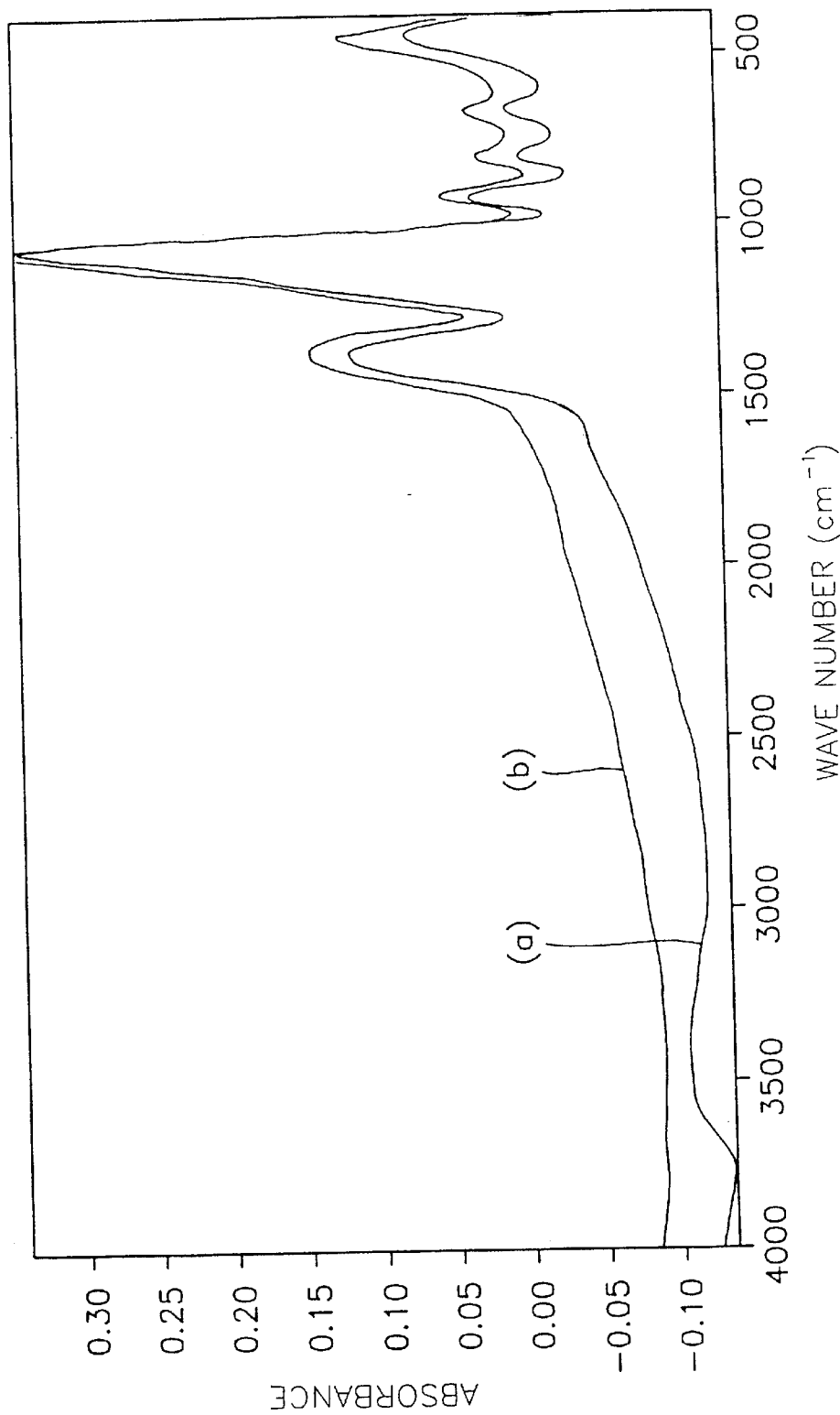
FIG. 1 shows Fourier Transform Infrared (FTIR) spectroscopy plots before and after electron beams radiate to a BPSG layer deposited on a semiconductor substrate by a CVD process.

In FIG. 1, plot (a) is absorptive when a BPSG layer is not radiated with electron beams after deposition, and plot (b) is not absorptive the BPSG layer is radiated with electron beams to density it. As shown in FIG. 1, a spectroscopic peak is shown at around 3000~3700 cm$^{-1}$ in plot (a). Such a peak, however, is not shown in plot (b) thus indicating that the moisture present in the BPSG film after deposition is substantially removed by electron beam radiation. Furthermore, it has been found that moisture absorption is greatly reduced in the radiated BPSG film during subsequent processes.

Figure 2:
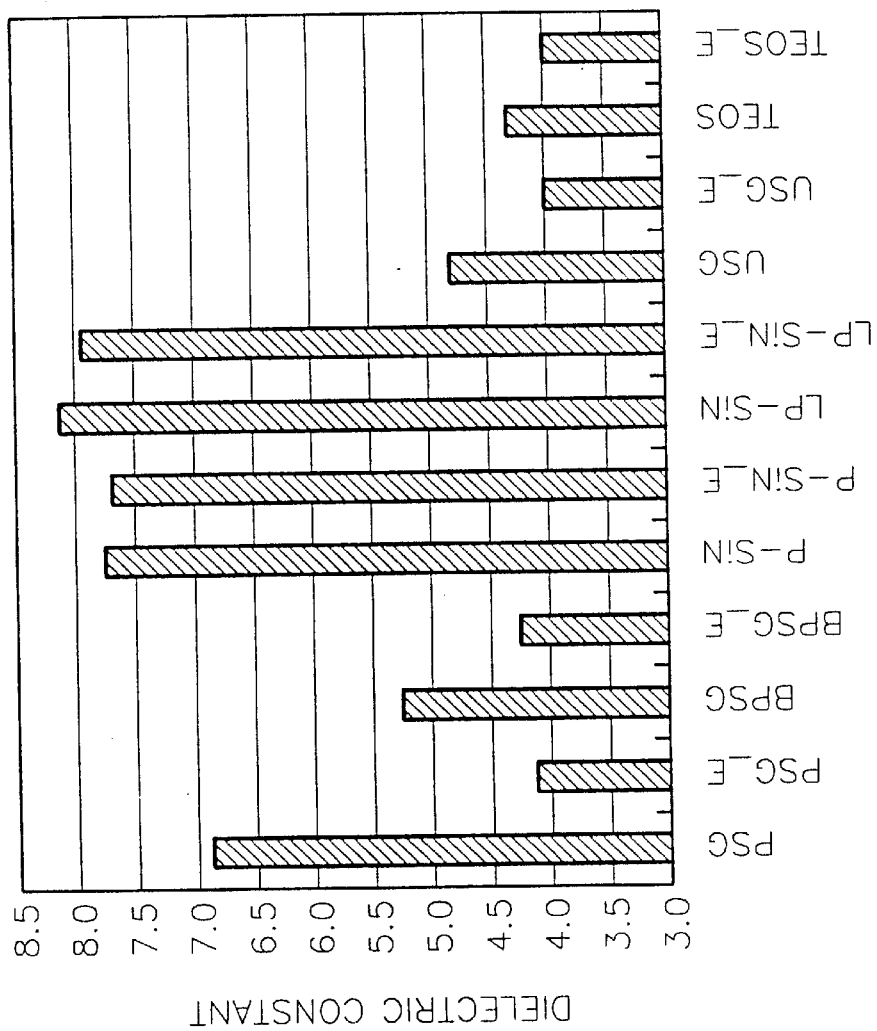
FIG. 2 is a graph showing dielectric constants before and after electron beams radiate various layers formed by a CVD process.

FIG. 2 is a graph showing dielectric constants before and after electron beams radiate the layers formed by a CVD process. In the graph, PSG indicates a PSG layer; BPSG indicates a BPSG layer; P-SiN indicates a SiN layer formed by plasma-enhanced CVD (PECVD) method; LP-SiN indicates a SiN layer formed by low-pressure CVD (LPCVD); USG indicates an USG layer; and TEOS indicates a tetra-ethyl-ortho-silicate (TEOS) layer. Also, PSG_E, BPSG_E, P-SiN_E, LP-SiN_E, USG_E and TEOS_E indicate a PSG layer, a BPSG layer, a P-SiN layer, a LP-SiN layer, a USG layer and a TEOS layer, all of which is radiated with electron beams. As shown in FIG. 2, the dielectric constants of each interlevel dielectric layer formed by the CVD process after the irradiation of electron beams becomes lower than the dielectric constants before the irradiation of electron beams.

Figure 3:
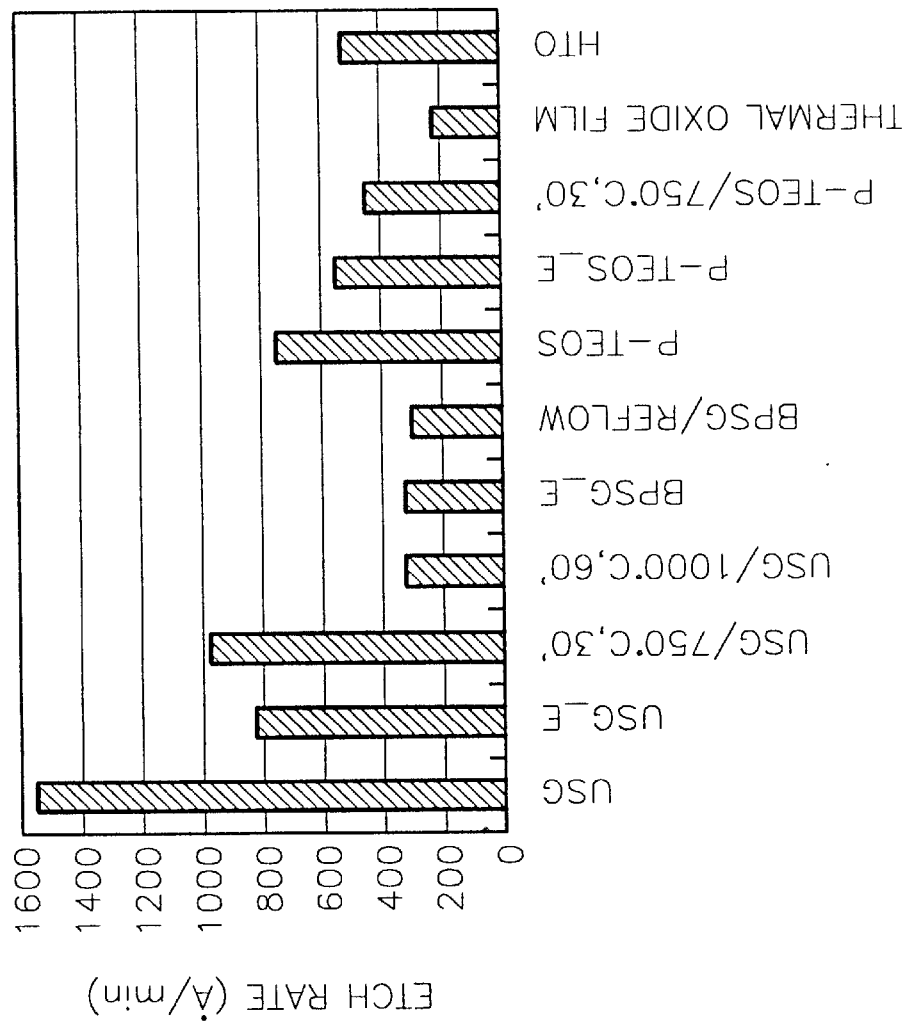
FIG. 3 is a graph showing wet etch rates of each oxide layer for an electron beam radiation process and for a conventional annealing process to density the oxide layers.

In FIG. 3, the wet etch rates of a thermal oxide film and a high temperature oxidation film are shown for comparison with the wet etch rates of the interlevel dielectric layers formed according to the present invention. As shown in FIG. 3, the etch rates of radiated interlevel dielectric layers after a CVD process is similar to the etch rates of interlevel dielectric layers annealed at 750° C. or more.

As described above, when electron beams radiate the interlevel dielectric layer including an oxide layer formed by the CVD process to densify the layer, the wet etch rate of the interlevel dielectric layer is at a conventional level, and simultaneously the dielectric constant is reduced. Also, moisture in the interlevel dielectric layer is effectively removed. Furthermore, the interlevel dielectric layers are prevented from being humidified in subsequent processes.

A low-humidity interlevel dielectric layer can be obtained according to the following low temperature process.

Figure 4:
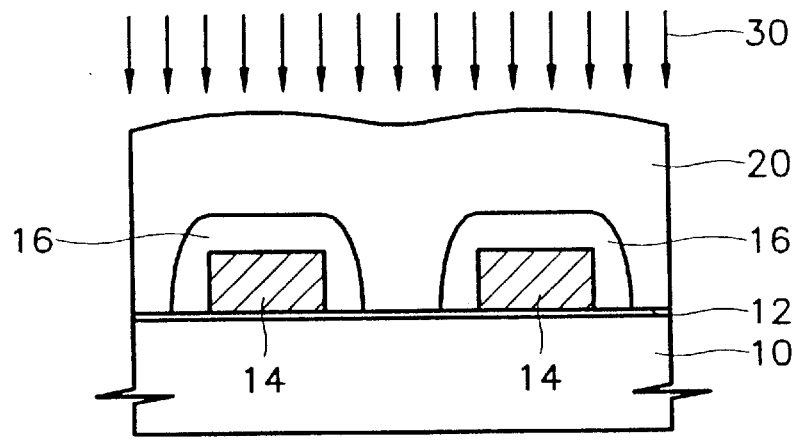
FIGS. 4 through 8 are sectional views illustrating a method for forming an interlevel dielectric layer of a semiconductor device according to the present invention.

Referring to FIG. 4, a conductive layer pattern 14 is formed on a dielectric layer 12 over a semiconductor substrate. A first capping layer 16 is formed on the conductive layer pattern 14. It is preferable that the first capping layer 16 is formed of a SiO$_2$ layer, a SiON layer or a SiN layer. The first capping layer 16 may be formed on sidewalls and an upper surface of the conductive layer pattern 14, or only the upper surface of the conductive layer pattern 14.

Then, a CVD oxide layer 20 is formed on the entire surface of the resultant structure. The CVD oxide layer 20 is formed of a layer selected from the group consisting of USG, BPSG, PSG, a borosilicate glass (BSG), a fluorine-doped silicate glass (FSG), SiN and SiON, formed by an atmospheric-pressure CVD (APCVD), a plasma-enhanced CVD (PECVD) or a low-pressure CVD (LPCVD) process.

Subsequently, electron beams 30 are radiated to the semiconductor substrate 10 at a temperature of between approximately room temperature and approximately 500° C. in a predetermined time for reaching a desired exposure dose, using an electron beam radiator, to density the CVD oxide layer 20. At this time, the electron beams are radiated, by applying a current of 5~25 mA, a voltage of 1,000~30,000 V to the electron beam radiator, and at an exposure dose of 2,000~10,000 μC/cm$^2$. The predetermined time can be varied according to the applied current or exposure dose for radiation of electron beams. If a current of 20 mA is applied at an exposure dose of 5,000 μC/cm$^2$, the predetermined time is about 300 seconds. The lower the current applied at a constant exposure dose, the more time for exposure is required. Incomplete bonds and moisture are removed from the CVD oxide layer 20 by the electron beams. Here, since the electrons in the beam do not have sufficient energy to etch the CVD oxide layer 20, the thickness of the CVD oxide layer 20 is not changed by the electron beam radiation, and the CVD oxide layer 20 is more stabilized.

Figure 5:
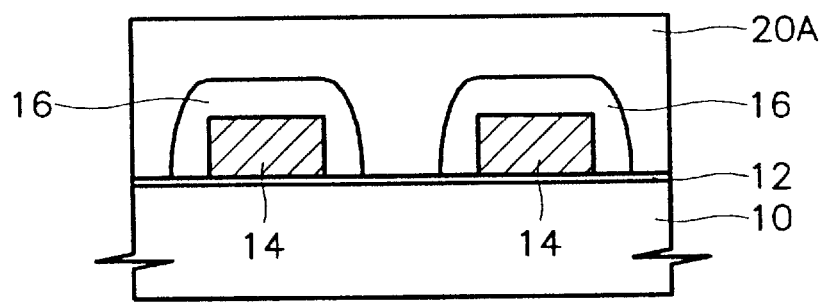

Referring to FIG. 5, the CVD oxide layer 20 is planarized by a CMP process to form a planarized interlevel dielectric layer 20A.

Figure 6:
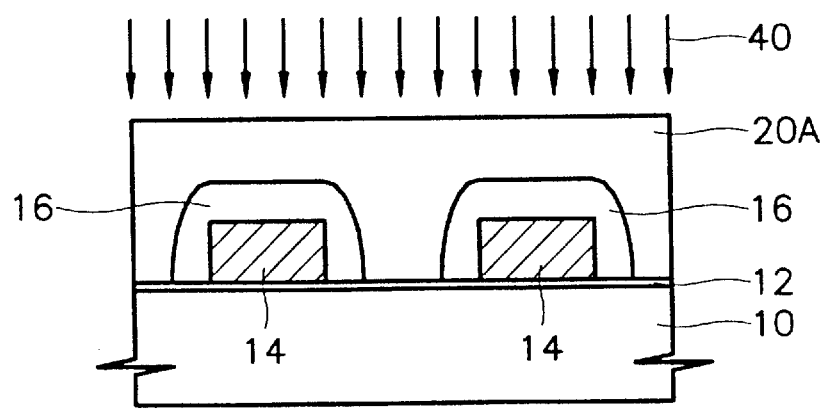

Referring to FIG. 6, electron beams 40 radiate the resultant structure where the interlevel dielectric layer 20A is formed in order to remove the moisture absorbed into the interlevel dielectric layer 20A during a CMP process by the same manner as shown in FIG. 4. At the same time, the interlevel dielectric layer 20A is prevented from being humidified during subsequent processes. The process of radiating electron beams 40 may be omitted if necessary.

Figure 7:
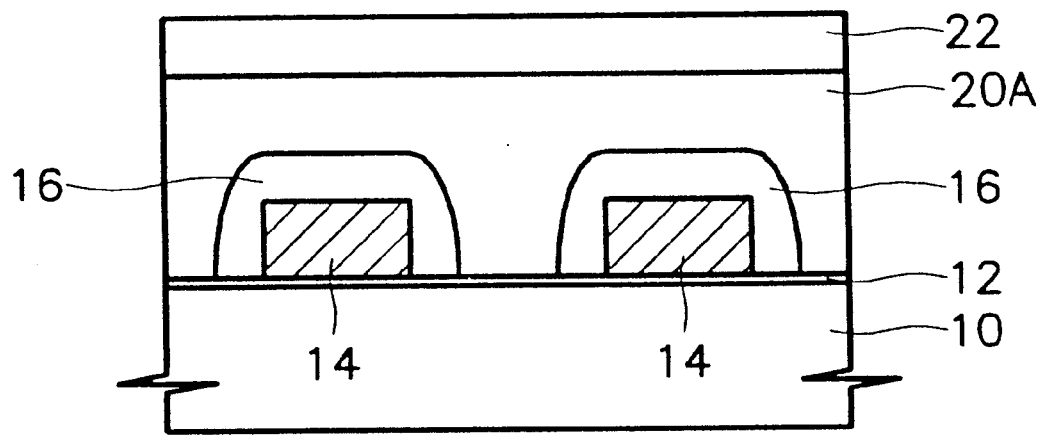

Referring to FIG. 7, a second capping layer 22 is formed on the interlevel dielectric layer 20A. The second capping layer 22 is formed for stabilizing and densifying the interlevel dielectric layer 20A, and for preventing the interlevel dielectric layer 20A from being humidified in subsequent processes, and the second capping layer 22 may be omitted if necessary. The second capping layer 22 may be a CVD oxide layer formed of USG, BPSG, PSG, BSG, FSG, SiN or SiON by APCVD, PECVD or LPCVD process.

Figure 8:
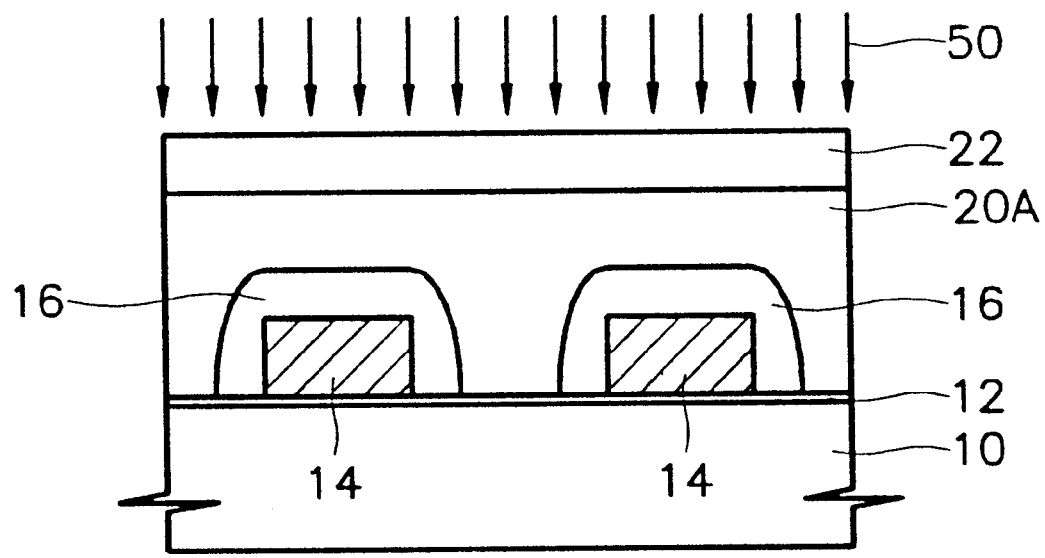

Referring to FIG. 8, electron beams 50 radiate the second capping layer 22, by the same manner as shown in FIG. 4.

When the CVD oxide layer 20 is planarized by a CMP process to form the interlevel dielectric layer 20A, and then electron beams 40 radiate the interlevel dielectric layer 20A, the radiation of electron beams 30 of FIG. 4 can be omitted.

Also, a semiconductor substrate can be annealed at 400~600° C. for approximately 30 min before or after forming the interlevel dielectric layer 20A.

As described above, electron beams radiate the interlevel CVD oxide layer to densify the layer. Accordingly, moisture of the interlevel CVD oxide layer can be effectively removed, and a humidification of the interlevel CVD oxide layer, which may occur during the subsequent processes, can be effectively prevented.

It should be understood that the invention is not limited to the illustrated embodiment and that many changes and modifications can be made within the scope of the invention by a person skilled in the art.

What is claimed is:

1. A method of forming an interlevel dielectric layer in a semiconductor device comprising:

forming a CVD oxide layer on a semiconductor substrate; and radiating the CVD oxide layer with electron beams at a temperature of between approximately room temperature and approximately 500° C. for a predetermined time, to densify the CVD oxide layer.

2. The method of claim 1, wherein the step of forming a CVD oxide layer comprises depositing a layer selected from the group consisting of USG, BPSG, PSG, BSG, FSG, SiN and SiON.

3. The method of claim 1, wherein radiating the CVD oxide layer further comprises generating an electron beam by applying a current of 5–25 mA and a voltage of 1,000–30,000 V to an electron beam radiator at an exposure dose of 2,000–10,000 $\mu C/cm^2$.

4. The method of claim 1, further comprising:
(a) forming a dielectric layer on the semiconductor substrate;
(b) forming a conductive layer pattern on the dielectric layer; and
(c) forming a first capping layer on the conductive layer pattern, step (a), (b), and (c) being performed before the formation of the CVD oxide layer.

5. The method of claim 4, wherein the first capping layer is formed of a layer selected from the group consisting of $SiO_2$, SiON and SiN.

6. The method of claim 4, wherein the first capping layer covers sidewalls and an upper surface of the conductive layer pattern.

7. The method of claim 4, wherein the first capping layer covers only an upper surface of the conductive layer pattern.

8. The method of claim 1, further comprising the step of planarizing the CVD oxide layer by a CMP process before radiating the CVD oxide layer with electron beams.

9. The method of claim 1, further comprising the step of planarizing the CVD oxide layer by a CMP process after radiating the CVD oxide layer with electron beams.

10. The method of claim 9, further comprising the step of radiating the planarized CVD oxide layer with an electron beam at a temperature of between approximately room temperature and approximately 500° C. for a predetermined time using an electron beam radiator, wherein radiating the planarized CVD oxide layer comprises generating an electron beam by applying a current of 5–25 mA and a voltage of 1,000–30,000 V to the electron beam radiator at an exposure dose of 2,000–10,000 $\mu C/cm^2$.

11. The method of claim 8, further comprising the step of forming a second capping layer on the planarized CVD oxide layer, wherein forming the second capping layer further comprises depositing a layer selected from the group consisting of USG, BPSG, PSG, BSG, FSG, SiN and SiON.

12. The method of claim 11, further comprising the step of radiating the second capping layer with an electron beam at a temperature of between approximately room temperature and approximately 500° C. for a predetermined time using the electron beam radiator, wherein radiating the second capping layer further comprises generating an electron beam by applying a current of 5~25 mA and a voltage of 1,000–30,000 V to the electron beam radiator at an exposure dose of 2,000–10,000 $\mu C/cm^2$.

13. The method of claim 9, further comprising the step of forming a second capping layer on the planarized CVD oxide layer, wherein forming the second capping layer comprises depositing a layer selected from the group consisting of USG, BPSG, PSG, BSG, FSG, SiN and SiON.

14. The method of claim 13, further comprising the step of radiating the second capping layer with an electron beam at a temperature of approximately room temperature to approximately 500° C. for a predetermined time using an electron beam radiator, wherein radiating the second capping layer further comprises generating an electron beam by applying a current of 5–25 mA and a voltage of 1,000–30,000 V to the electron beam radiator at an exposure dose of 2,000~10,000 $\mu C/cm^2$.

15. A method for forming an interlevel dielectric layer in a semiconductor device comprising the steps of:
a) forming a CVD oxide layer on a semiconductor substrate;
b) planarizing the CVD oxide layer by a CMP process; and
c) radiating the planarized CVD oxide layer with electron beams at a temperature of between approximately room temperature and approximately 500° C. for a predetermined time, using an electron beam radiator, to densify the layer.

16. The method of claim 15, further comprising the step of annealing the CVD oxide layer at a temperature of 400–600° C., before the step of planarizing.

17. The method of claim 15, further comprising the step of annealing the CVD oxide layer at a temperature of 400–600° C. after the step of planarizing.

18. The method of claim 15, wherein radiating the planarized CVD oxide layer further comprises generating an electron beam by applying a current of 5~25 mA and a voltage of 1,000~30,000 V to the electron beam radiator at an exposure dose of 2,000~10,000 $\mu C/cm^2$.

19. A method for forming an interlevel dielectric layer in a semiconductor device comprising the steps of:
a) forming a CVD oxide layer on a semiconductor substrate;
b) planarizing the CVD oxide layer by a CMP process;
c) forming a capping layer composed of an oxide layer on the planarized CVD oxide layer; and
d) radiating the capping layer with electron beams at a temperature of between approximately room temperature and approximately 500° C. for a predetermined temperature, using an electron beam radiator, to densify the layer.

* * * * *

UNITED STATES PATENT AND TRADEMARK OFFICE
CERTIFICATE OF CORRECTION

PATENT NO.   : 6,057,251
DATED        : May 2, 2000
INVENTOR(S)  : Goo et al.

It is certified that error appears in the above-identified patent and that said Letters Patent is hereby corrected as shown below:

Column 2,
Lines 31, 54 and 65, "density" should read -- densify --.

Column 3,
Lines 6 and 67, "density" should read -- densify --.

Column 6,
Line 24, "density" should read -- densify --.
Line 48, "temperature" should read -- time --.

Signed and Sealed this

Twenty-seventh Day of May, 2003

JAMES E. ROGAN
*Director of the United States Patent and Trademark Office*